US006998307B2

(12) United States Patent
Sell et al.

(10) Patent No.: US 6,998,307 B2
(45) Date of Patent: Feb. 14, 2006

(54) METHOD FOR FABRICATING A STORAGE CAPACITOR

(75) Inventors: Bernhard Sell, Portland, OR (US); Annette Sänger, Dresden (DE); Dirk Schumann, Schönfliess (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/650,055

(22) Filed: Aug. 26, 2003

(65) Prior Publication Data

US 2004/0147074 A1 Jul. 29, 2004

Related U.S. Application Data

(63) Continuation of application No. PCT/DE02/00436, filed on Feb. 6, 2002.

(30) Foreign Application Priority Data

Feb. 26, 2001 (DE) ................................ 101 09 218

(51) Int. Cl.
*H01L 21/8242* (2006.01)

(52) U.S. Cl. ........................ 438/243; 438/253; 438/396

(58) Field of Classification Search ................ 438/243, 438/253, 396, 398, 386

See application file for complete search history.

(56) References Cited

U.S. PATENT DOCUMENTS 4,589,193 A 5/1986 Goth et al.
5,262,343 A 11/1993 Rhodes et al.
5,336,912 A * 8/1994 Ohtsuki ....................... 257/304
5,395,786 A * 3/1995 Hsu et al. .................... 438/248
5,658,816 A * 8/1997 Rajeevakumar ............. 438/386
5,692,281 A * 12/1997 Rajeevakumar ............ 29/25.42
5,760,434 A 6/1998 Zahurak et al.
5,905,279 A 5/1999 Nitayama et al.
6,194,755 B1 * 2/2001 Gambino et al. ........... 257/301
6,228,706 B1 * 5/2001 Horak et al. ................ 438/244
6,258,689 B1 * 7/2001 Bronner et al. ............. 438/386
6,373,091 B1 * 4/2002 Horak et al. ................ 257/306
6,727,540 B1 * 4/2004 Divakaruni et al. ........ 257/301
6,797,636 B1 * 9/2004 Tews et al. ................. 438/706
2002/0125521 A1 9/2002 Schrems

FOREIGN PATENT DOCUMENTS

EP 0 495 991 A1 7/1992
EP 0 967 643 A2 12/1999

(Continued)

OTHER PUBLICATIONS

Alperin, M. E. et al.: "Development of the Self-Aligned Titanium Silicide Process for VLSI Applications", IEEE Journal of Solid-State Circuits, vol. SC-20, No. 1, Feb. 1985, pp. 61-69.

(Continued)

*Primary Examiner*—Laura M. Schillinger
(74) *Attorney, Agent, or Firm*—Laurence A. Greenberg; Werner H. Stemer; Ralph E. Locher

(57) ABSTRACT

The present invention relates to a novel method for fabricating a storage capacitor designed as a trench or a stacked capacitor and is used in particular in a DRAM memory cell. The method includes steps of forming a lower, metallic capacitor electrode, a storage dielectric and an upper capacitor electrode. The lower, metallic capacitor electrode is formed in a self-aligned manner on a silicon base material in such a way that uncovered silicon regions are first produced at locations at which the lower capacitor electrode will be formed, and then metal silicide is selectively formed on the uncovered silicon regions.

6 Claims, 12 Drawing Sheets

FOREIGN PATENT DOCUMENTS

| | | | | |
|---|---|---|---|---|
| EP | 0967643 | A2 | * | 12/1999 |
| EP | 0 981 164 | A2 | | 2/2000 |
| JP | 63062371 | | | 3/1988 |
| WO | 01/17014 | A1 | | 3/2001 |
| WO | 01/20681 | A1 | | 3/2001 |

OTHER PUBLICATIONS

Yamada, K. et al.: "A Deep-Trenched Capacitor Technology for 4 Mega Bit Dynamic Ram", IEEE, IEDM 85, 29.3, pp. 702-705.

* cited by examiner

METHOD FOR FABRICATING A STORAGE CAPACITOR

CROSS-REFERENCE TO RELATED APPLICATION

This application is a continuation of copending International Application No. PCT/DE02/00436, filed Feb. 6, 2002, which designated the United States and was not published in English.

BACKGROUND OF THE INVENTION

FIELD OF THE INVENTION

The present invention relates to fabricating a storage capacitor for use in a DRAM (dynamic random access memory) memory cell, in which the lower capacitor is designed as a metallic electrode.

In dynamic random access memory cell configurations, what are known as single-transistor memory cells are almost exclusively used. A single-transistor memory cell includes a read transistor and a storage capacitor. The information is stored in the storage capacitor in the form of an electric charge which represents a logic 0 or a logic 1. Actuating the read transistor via a word line allows this information to be read via a bit line. The storage capacitor must have a minimum capacitance for reliably storing the charge and, at the same time, for enabling differentiation between the information item that has been read. The lower limit for the capacitance of the storage capacitor is currently considered to be 25 fF.

Since the storage density increases from memory generation to memory generation, the surface area required by the single-transistor memory cell must be reduced from generation to generation. At the same time, the minimum capacitance of the storage capacitor has to be retained.

Up to the 1 Mbit generation, both the read transistor and the storage capacitor have been produced as planar components. Beyond the 4 Mbit memory generation, the area taken up by the memory cell was reduced further by using a three-dimensional configuration of the read transistor and the storage capacitor. One possibility is to produce the storage capacitor in a trench (See for example K. Yamada et al., Proc. Intern. Electronic Devices and Materials IEDM 85, pp. 702 ff.). In this case, a diffusion region that adjoins the wall of the trench and a doped polysilicon filling configured in the trench act as electrodes for the storage capacitor. Therefore, the electrodes of the storage capacitor are configured along the surface of the trench. In this way, the effective surface area of the storage capacitor, on which the capacitance is dependent, is increased with respect to the space taken up by the storage capacitor on the surface of the substrate. This effective surface area corresponds to the cross section of the trench. Reducing the cross section of the trench enables the packing density to be increased further. However, limits are imposed on the extent to which the depth of the trench can be increased, for technological reasons.

In an alternative capacitor design, the storage capacitor is formed as a stack on the selection transistor.

U.S. Pat. No. 5,760,434 discloses a method for fabricating a DRAM memory cell with a stacked capacitor, in which, after the selection transistor has been formed and a polysilicon connecting structure for the active regions of the transistor has been produced, the resulting surface is planarized, for example using BPSG, and then contact holes are etched down to the connecting structures. Then, polysilicon is deposited on the entire surface, i.e. including outside the contact holes, followed, for example, by the deposition of tungsten. The formation of silicide is caused by a subsequent heat treatment step. Then, the unreacted metal is removed by a selective etching process. The tungsten silicide that is formed outside the contact holes is subsequently removed by chemical mechanical polishing.

U.S. Pat. No. 5,262,343 describes a method for fabricating a stacked capacitor, in which a polysilicon layer is patterned photolithographically and, after removing the photoresist material, a metal such as, for example, platinum, chromium, cobalt or others is deposited on the polysilicon and is subsequently subjected to a heat treatment in order to form the metal silicide.

U.S. Pat. No. 5,905,279 discloses a memory cell having a storage capacitor configured in a trench and a selection transistor, in which the storage capacitor has a lower capacitor electrode that adjoins a wall of the trench, a capacitor dielectric, and an upper capacitor electrode that includes a conductive layer, in particular, made from WSi, TiSi, W, Ti or TiN.

Published European Patent Application EP 495 991 A1 describes a method for fabricating a ferroelectric memory, in which the ferroelectric capacitor is designed as a planar capacitor. According to a preferred embodiment, the lower capacitor electrode is PtSi or TiSi and is formed only above the contact hole above the source region.

A method for the self-aligned formation of titanium silicide to produce planar structures, such as for example, a gate electrode, is also known from IEEE Journal Solid-State Circuits, Vol. SC-20, No. 1, 1985, pages 61 to 69.

Moreover, it is proposed in the published PCT application WO 01/17014 A1, which is a later publication, to design the lower capacitor electrode, which is in a memory cell with a selection transistor and trench capacitor, as a metallic electrode. The metallic electrode is formed by using a CVD (chemical vapor deposition) process to deposit tungsten silicide over the entire surface in the trench which, in the upper region, is lined with a silicon nitride spacer layer. Then, through the deposition of photoresist in the trench, the lower part of the trench is provided with a resist filling, which is used as an etching mask in a subsequent step for etching the tungsten silicide. Then, the photoresist filling is removed and the capacitor and then the memory cell are completed in a known way.

International publication WO 01/20681, which is likewise a later publication, describes a method for fabricating a trench capacitor, in which the lower capacitor electrode is designed in such a way that it is not only configured in the lower trench region but also extends along the insulation collar.

SUMMARY OF THE INVENTION

It is accordingly an object of the invention to provide a method for fabricating a storage capacitor which overcomes the above-mentioned disadvantages of the prior art methods of this general type.

According to the present invention, the object is achieved by a method for fabricating a storage capacitor having a vertical structure with respect to a main surface of a substrate, in particular for use in a DRAM memory cell. A lower, metallic capacitor electrode, a storage dielectric and an upper capacitor electrode are formed in or on the main surface of the substrate. The lower, metallic capacitor electrode is formed in a self-aligned manner on a silicon base material in such a manner that, first of all, uncovered silicon regions are produced at the locations at which the lower capacitor electrode is to be formed, and then metal silicide is formed selectively on the uncovered silicon regions. The step of selectively forming metal silicide on the uncovered silicon regions includes the step of selectively depositing the metal silicide on the uncovered silicon regions from the vapor phase.

In particular, the object is achieved by a method for fabricating a memory cell having a storage capacitor designed as a trench capacitor and a selection transistor. The method includes the following steps: etching a trench into a main surface of a semiconductor substrate; carrying out the method described immediately above, with the storage capacitor configured at least partially in the trench and the lower, metallic capacitor electrode adjoining a wall of the trench; and forming the selection transistor with a source electrode, a drain electrode, a conductive channel and a gate electrode. The upper capacitor electrode is connected in an electrically conductive manner to the source or drain electrode of the selection transistor.

Furthermore, the object is achieved by a method for fabricating a memory cell having a storage capacitor designed as a stacked capacitor and a selection transistor. The method includes forming a selection transistor with a source electrode, a drain electrode, a conductive channel and a gate electrode on a main surface of a semiconductor substrate, and performing the steps involved in the method described above, so that the lower capacitor electrode is formed on an electrically conductive connecting structure made from polysilicon, which connects the lower capacitor electrode to the source or drain electrode of the selection transistor, on the resulting surface.

In this context, a storage capacitor having a vertical structure with respect to a main surface of a substrate is essentially a non-planar capacitor, for example, a trench capacitor or a stacked capacitor. More precisely, a capacitor of this type has electrodes that do not extend exclusively parallel to the substrate surface, but rather also has components which are perpendicular to the substrate surface.

In particular, the lower capacitor electrode has a vertical component. The ratio of the vertical component to the parallel component is greater than 1.

Trench capacitors typically have an aspect ratio of depth (vertical component) to width (parallel component) of between 20:1 and approximately 60:1. Stacked capacitors typically have an aspect ratio of 5:1 to 20:1.

The object of the invention is also achieved by a method for fabricating a trench capacitor, in particular for use in a DRAM memory cell. The method includes the steps of etching a trench into a main surface of a silicon substrate, producing uncovered silicon regions by applying a covering material to the trench regions on which the lower capacitor electrode should not be formed, and forming the lower metallic capacitor electrode in a self-aligned manner by selectively forming metal silicide on the uncovered silicon regions. The storage capacitor is configured at least partially in the trench and the lower, metallic capacitor electrode adjoins a wall of the trench. The method also includes providing a storage dielectric and an upper capacitor electrode.

The method for fabricating a storage capacitor is substantially based on the fact that the lower capacitor electrode of the storage capacitor is formed in a self-aligned fashion. More precisely, in the method, the lower capacitor electrode is formed from a metal silicide selectively on uncovered silicon regions. In this context, the term "uncovered silicon regions" covers all types of silicon, in particular, monocrystalline silicon and polycrystalline silicon (polysilicon), but also, by way of example, amorphous silicon. According to the present invention, uncovered silicon regions can be produced in particular as a result of covering the regions, which are on a silicon base material on which the lower capacitor electrode should not be formed, with a covering material, for example, $Si_3N_4$ or $SiO_2$ or a combination of these materials.

Alternatively, a structured Polysilicon layer can be applied to a non-silicon base material, for example, by first applying the polysilicon all over the surface area and subsequently by removing the layer, for example, by etching or by chemical-mechanical polishing those parts on which a lower capacitor electrode should not be formed. The non-silicon base material encompasses all materials except for silicon, for example, monocrystalline silicon, polysilicon, and amorphous silicon. The non-silicon base material itself can quite possibly contain silicon, such as, silicon dioxide or silicon nitride.

The following advantages can be derived from the inventive method:

- The self-aligned formation of the metal silicide layer on uncovered silicon regions is less complicated than the method described above, in which the metal silicide layer is applied to the entire surface and is then selectively etched. Particularly if the covering material used to cover the silicon regions at which a metal silicide layer is not subsequently to be produced later acts as an insulation collar of the storage capacitor or as a diffusion barrier, the self-aligned formation of the metal silicide layer does not require any additional process steps for patterning.
- In the conventional method, it is difficult to ensure that the metal silicide layer is removed selectively in the region of the silicon nitride spacer while being entirely retained in the lower region of the trench, so that there is no uncovered silicon in contact with the capacitor dielectric. In contrast, if metal silicide is formed in a self-aligned form, it is ensured that all of the uncovered silicon regions are covered by a layer of the metal silicide. This is very important to minimize leakage currents, since such currents would flow via uncovered silicon regions that are in contact with the capacitor dielectric. If leakage currents are minimized, conversely, the layer thickness of the capacitor dielectric can be reduced once again, with the result that the capacitance of the capacitor is increased.
- Since in the conventional method, photoresist fills up the lower region of the trenches and is then removed, there are problems with further reducing the feature size. By contrast, the method can be scaled to smaller sizes without problems.
- The method can be combined with measures for increasing the surface area, such as for example, the HSG method (roughening of the silicon surface, hemispherical graining) or mesopore etching.
- The electrode configuration which can be fabricated using the inventive method is thermally stable and is able to withstand all of the subsequent steps involved in the DRAM process which is currently used.
- A particular advantage of the inventive method results if, for the self-aligned formation of the metal silicide, a metal layer is deposited or a vapor-phase process using a metal-containing vapor is carried out. This is because in this case forming the metal silicide only requires one metal-containing precursor and does not require a silicon-containing precursor. This results in the advantage that the deposition behavior of only one precursor has to be taken into account, so that, first, the edge coverage, which is of critical importance in particular during the deposition on a structure that is built up vertically, and, second, the stoichiometric ratio of the resulting layer can be set in the desired way. Particularly in the case of capacitor trenches with a high aspect ratio, conventional deposition methods result in the drawback that the stoichiometric ratio of the metal silicide layer is dependent on the depth of the trench. This drawback can be avoided by a deposition method that uses only one precursor.

According to one embodiment of the present invention, in which the capacitor is designed as a trench capacitor, to form the lower, metallic capacitor electrode, first of all, selected regions of the trench, at which the lower capacitor electrode is not to be formed, are covered with a covering material, for example, silicon nitride, silicon dioxide or a combination of these materials.

It is expedient for a covering material to be applied with a composition and in a thickness such that it will subsequently act as an insulating collar of the finished storage capacitor or as a diffusion barrier. In this case, the fabrication method becomes particularly simple, since there is no need for any additional steps for patterning the silicon base material.

According to another embodiment of the present invention, in which the capacitor is designed as a stacked capacitor, polysilicon is applied selectively only at those locations on the surface at which the lower capacitor electrode is also subsequently to be fabricated. In this case too, the fabrication method is simplified by the fact that no additional steps for patterning the silicon base material are required.

Then, metal silicide is formed selectively on the uncovered silicon regions.

This can be effected, for example, using a method which is also known as a salicide method (self-aligned silicide). For this purpose, a metal layer, for example tungsten, titanium, tantalum, molybdenum, cobalt, nickel, niobium-platinum, palladium or a rare earth, is deposited. Then, a heat treatment step is carried out, for example, depending on the metal used, in a nitrogen atmosphere at a temperature of 600 to 1000° C. During this heat treatment step, the deposited metal reacts with the silicon below it to form metal silicide, while the metal that has been deposited on the covering material does not react. In a subsequent selective etching step, the unreacted metal is etched away and the metal silicide remains on the silicon regions.

According to a preferred embodiment of the present invention, the heat treatment step can be carried out in such a way that not all the metal layer is converted into a silicide all the way through. In this case, the heat treatment step is carried out at a suitably, low temperature, so that the formation of silicide proceeds relatively slowly, and the duration of the heat treatment is set in such a way that the metal layer does not completely form a silicide all the way through.

This embodiment has the additional advantage that it is possible to compensate for an inhomogeneity during the deposition of metal, since at the locations at which the metal has been deposited with a relatively great layer thickness, the unconverted metal is removed during the subsequent step. This measure advantageously makes it possible to produce very thin metal electrodes with minimal capacitance losses.

However, the selective formation of metal silicide may also take place through the selective deposition of metal silicide. By way of example, given accurate setting of parameters, it is possible to bring about a selective reaction between a metal-containing gas, for example, $WF_6$, and the uncovered silicon using a vapor-phase method with the metal-containing gas. In this case, the uncovered silicon is etched away slightly at the surface and, during the deposition method, undergoes a reaction with the metal-containing gas, resulting in the formation, inter alia, of a metal silicide layer.

Alternatively, however, it is also possible for the metal silicide layer to be formed selectively on the uncovered silicon regions by a CVD method using a silicon-containing gas, for example, $SiH_4$ or $SiH_2Cl_2$, and a metal-containing gas, for example, $WF_6$, $TaCl_5$ or $TiCl_4$, under suitable conditions.

The methods for the selective deposition of a metal silicide are advantageous to the extent that there is no need for a subsequent heat treatment step. However, the deposition conditions, in particular the pressure and temperature, have to be set very accurately, and consequently the process window is reduced in size and it is questionable to what extent these methods can be used in industrial chip production.

According to the present invention, the substrate in which the memory cell is formed may be an ordinary silicon substrate or an SOI substrate (silicon on insulator or silicon on insulator substrate). The use of an SOI substrate is advantageous in that the procedure can be further simplified, since the buried silicon dioxide layer acts as an etching stop layer. In particular, when using an SOI substrate, there is no need for a sufficiently thick (approx. 20 nm) insulating collar to be deposited in the upper trench region, with the result that, when using a silicon substrate, the trench opening is greatly narrowed, making the procedure correspondingly more difficult.

According to the present invention, the effective capacitor area and therefore the capacitance of the storage capacitor can be increased by the fact that, after the step for producing uncovered silicon regions, measures which increase the surface area are carried out at these regions. By way of example, it is possible to etch mesopores, or to perform a method for crystallizing a previously applied amorphous silicon layer by applying crystallization nuclei, followed by a heat treatment. Naturally, it is also possible to carry out any other method that increases the surface area prior to applying the metal layer or metal silicide layer.

Other features which are considered as characteristic for the invention are set forth in the appended claims.

Although the invention is illustrated and described herein as embodied in a method for fabricating a storage capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
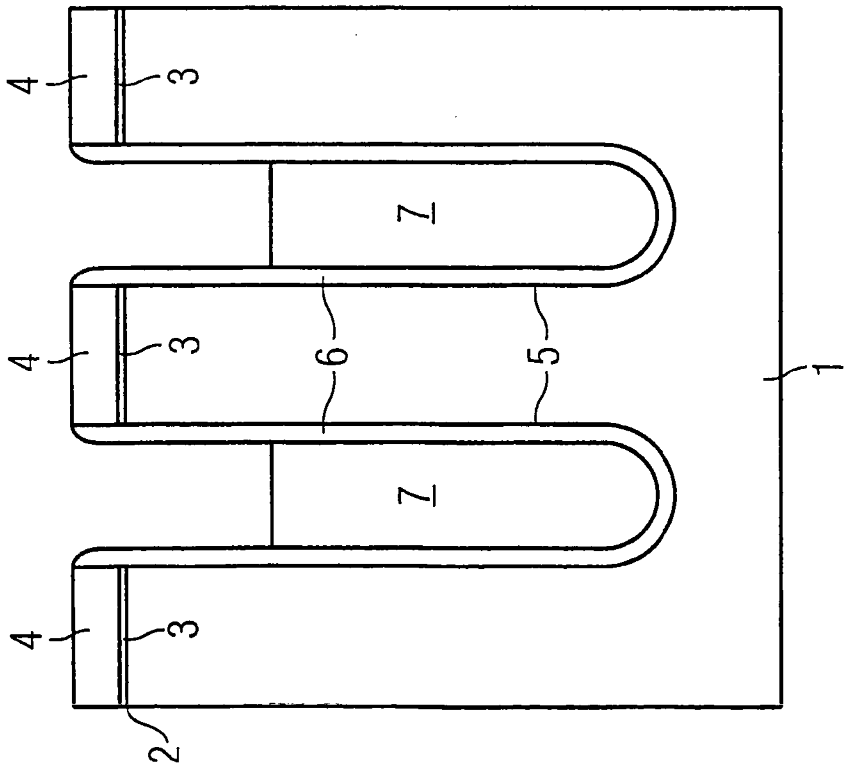

Referring now to the figures of the drawing in detail and first, particularly, to FIG. 1 thereof, there is shown a silicon substrate 1 with a main surface 2. A 5 nm thick $SiO_2$ layer 3 and a 200 nm thick $Si_3N_4$ layer 4 are applied to the main surface 2. Then, a 1000 nm thick BSG, layer (not shown) is applied as hard mask material.

Using a mask produced by photolithography (not shown), the BSG layer, the $Si_3N_4$ layer 4 and the $SiO_2$ layer 3 are patterned in a plasma etching process using $CF_4/CHF_3$, so that a hard mask is formed. After removing the mask produced by photolithography, trenches 5 are etched into the main surface 1 in a further plasma etching process using $HBr/NF_3$ and the hard mask as an etching mask. Then, the BSG layer is removed by a wet etch using $H_2SO_4/HF$.

The depth of the trenches 5 is, for example, 5 μm, their width is 100×250 nm and they are spaced apart from one another by 100 nm.

Next, a 10 nm thick $SiO_2$ layer 6, which may also be doped, for example by in-situ doping, is deposited. The deposited $SiO_2$ layer 6 covers at least the walls of the trenches 5. Depositing a 200 nm thick polysilicon layer, chemically mechanically polishing down to the surface of the $Si_3N_4$ layer 4, and etching back the polysilicon layer using $SF_6$ results in the production of a polysilicon filling 7 in each of the trenches 5. The surface of this polysilicon filling is configured 1000 nm below the main surface 2 (See FIG. 1). If appropriate, the chemical mechanical polishing can be dispensed with. The polysilicon filling 7 is used as a sacrificial layer for the subsequent $Si_3N_4$ spacer deposition. Next, the $SiO_2$ layer 6 on the walls of the trenches 5 is etched isotropically.

Then, a CVD process is used to deposit a 20 nm thick spacer layer 9 that includes silicon nitride and/or silicon dioxide. This spacer layer is then etched in an anisotropic plasma etching process using $CHF_3$. The spacer layer 9 that has just been deposited is used as a covering material in the step for selectively forming metal silicide on uncovered silicon regions. In the finished memory cell, it is used to switch off the parasitic transistor that would otherwise form at this location, and therefore acts as the insulating collar.

Figure 2:
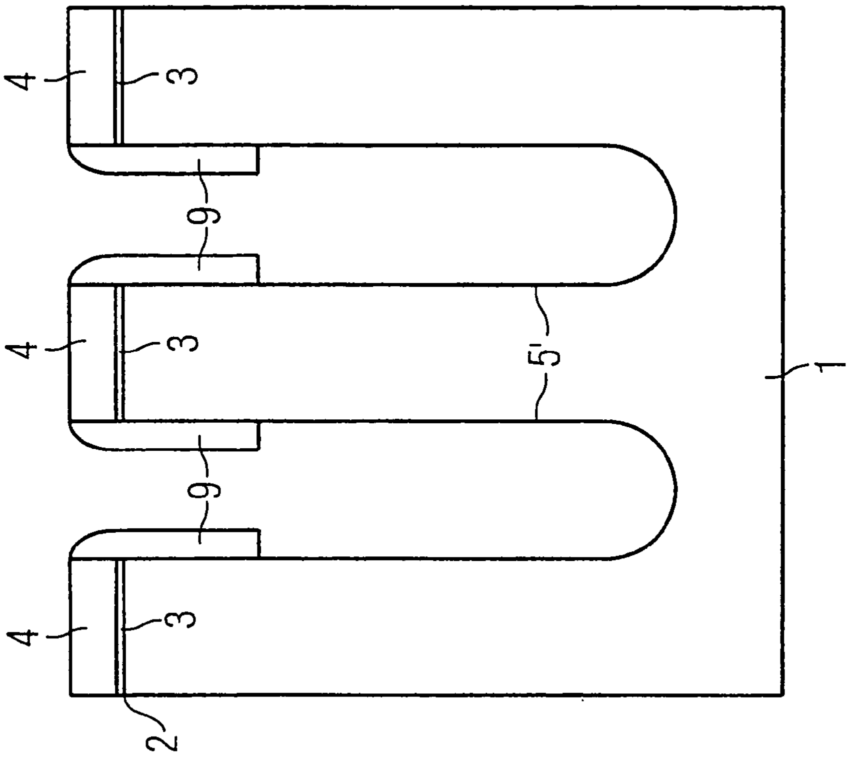
FIGS. 1–7 are cross-sectional views of a silicon substrate for illustrating the steps of a first embodiment of the method for fabricating the lower electrode of a memory cell.

Then, $SF_6$ is used to etch polysilicon selectively with respect to $Si_3N_4$ and $SiO_2$. In the process, the polysilicon filling 7 is removed completely from each of the trenches 5. The part of the $SiO_2$ layer 6 that has now been uncovered is removed by etching using $NH_4F/HF$ (See FIG. 2).

If appropriate to widen the lower regions of the trenches 5, i.e. in the region remote from the main surface 2, silicon is then etched selectively with respect to the spacer layer. This is effected, for example, by an isotropic etching step using ammonia, in which silicon is etched selectively with respect to $Si_3N_4$. The etching time is such that 20 nm of silicon is etched. In this way, the, cross section is widened by 40 nm in the lower region of the trenches 5. As a result, the capacitor area and therefore the capacitance of the capacitor can be increased further.

The drawings illustrate the process sequence with unwidened trenches.

Then, if this has not already been effected by the doped oxide, the silicon substrate is doped. This can be achieved, for example, by depositing an arsenic doped silicate glass layer in a layer thickness of 50 nm and a TEOS-$SiO_2$ layer in a thickness of 20 nm, followed by a heat treatment step at 1000° C., 120 seconds, resulting in the diffusion out of the arsenic-doped silicate glass layer, and the formation of an $n^+$-doped region 11 in the silicon substrate 1. Alternatively, it is also possible to carry out vapor-phase doping, for example, using the following parameters: 900° C., 399 Pa tributylarsine (TBA) (33 per cent), 12 min.

The $n^+$-doped region reduces the size of the depletion zone, with the result that the capacitance of the capacitor is increased further. When a metallic bottom electrode is used, this doped layer is used to fabricate an ohmic contact between the substrate and the metal.

Figure 3:
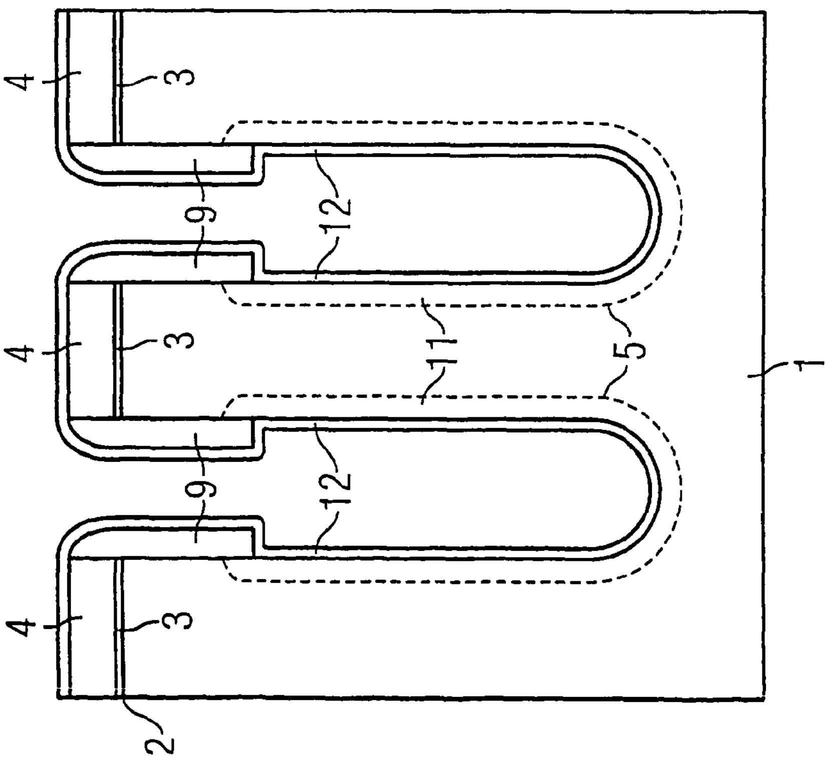

Then, a 10 nm thick tungsten layer 12 is deposited over the entire surface, for example using a CVD method (See FIG. 3).

Figure 4:
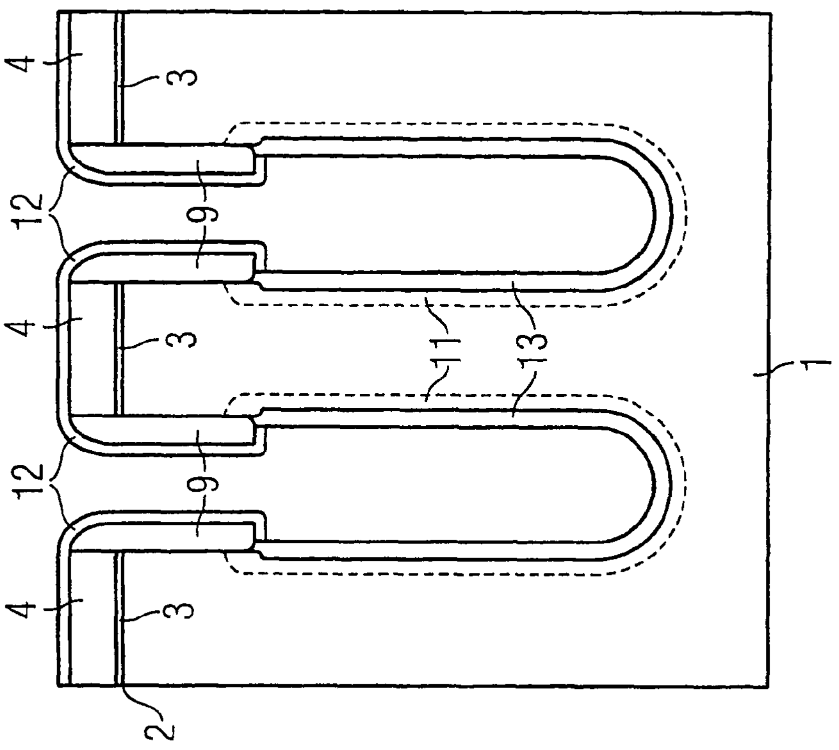

In a subsequent heat treatment step at 600 to 800° C. in a nitrogen atmosphere ($N_2$-RTP, rapid thermal annealing), the self-aligned tungsten silicide is formed. More specifically, tungsten silicide 13 is formed only at the locations at which the tungsten has been deposited directly on the silicon, while the metal which has been deposited directly on the nitride does not react with the substrate. This is illustrated in FIG. 4. In this step, a slight widening of the capacitor trenches results from the fact that, for the formation of tungsten silicide, silicon is consumed at the walls of the trenches.

According to a preferred embodiment, this heat treatment step can be set in such a way that not all of the tungsten forms a silicide all the way through. Consequently, as described above, it is possible to produce particularly thin metal electrodes. In addition, it is possible to compensate for inhomogeneities in the layer thickness of the metal.

Figure 5:
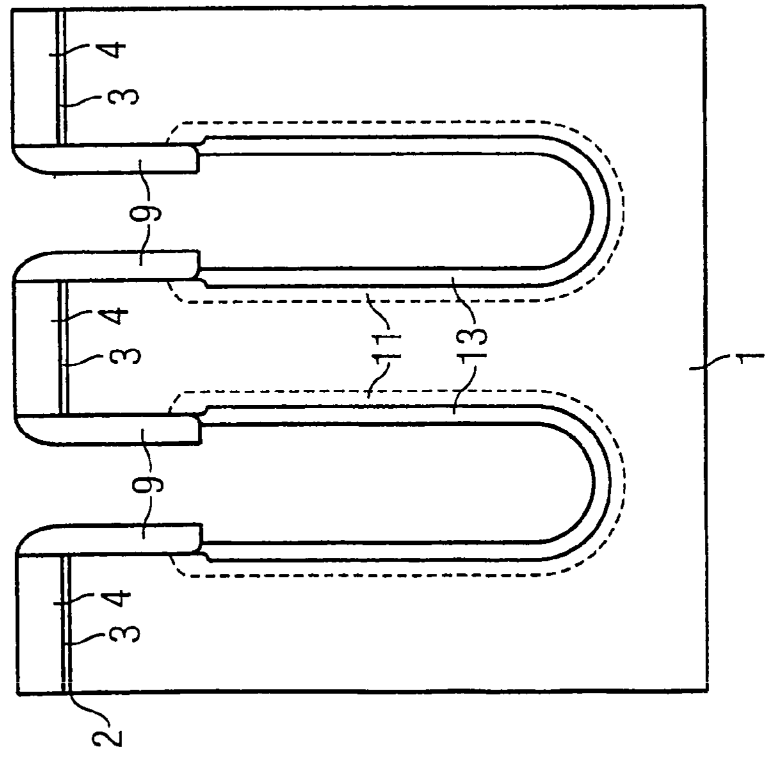

Finally, the tungsten is etched selectively with respect to the tungsten silicide. This can be achieved, for example, by wet etching in $H_2O/NH_4OH/H_2O_2$ (See FIG. 5).

This step does not attack the part of the tungsten layer which was deposited on the uncovered silicon and which reacted therewith during the heat treatment step to form tungsten silicide, while the part of the tungsten layer which was deposited on the silicon nitride or silicon dioxide and also, if appropriate, the unreacted part of the tungsten layer deposited on the silicon is removed. Accordingly, after this selective etching step, what remains is a self-aligned tungsten silicide layer which covers the previously uncovered silicon regions. This ensures that, after the subsequent deposition of the dielectric, there are no uncovered silicon regions in direct contact with the dielectric, with the result that the leakage currents are minimized.

Naturally, the methods which have been described in more detail above can also be used as alternative methods for the self-aligned formation of metal silicide.

If appropriate, a second heat treatment step at 960° C. in a nitrogen atmosphere can then be carried out thereafter ($N_2$-RTP (rapid thermal annealing)). This step leads to restructuring of the WSiX which is formed, and free tungsten and silicon bonds are saturated by nitrogen.

Figure 6:
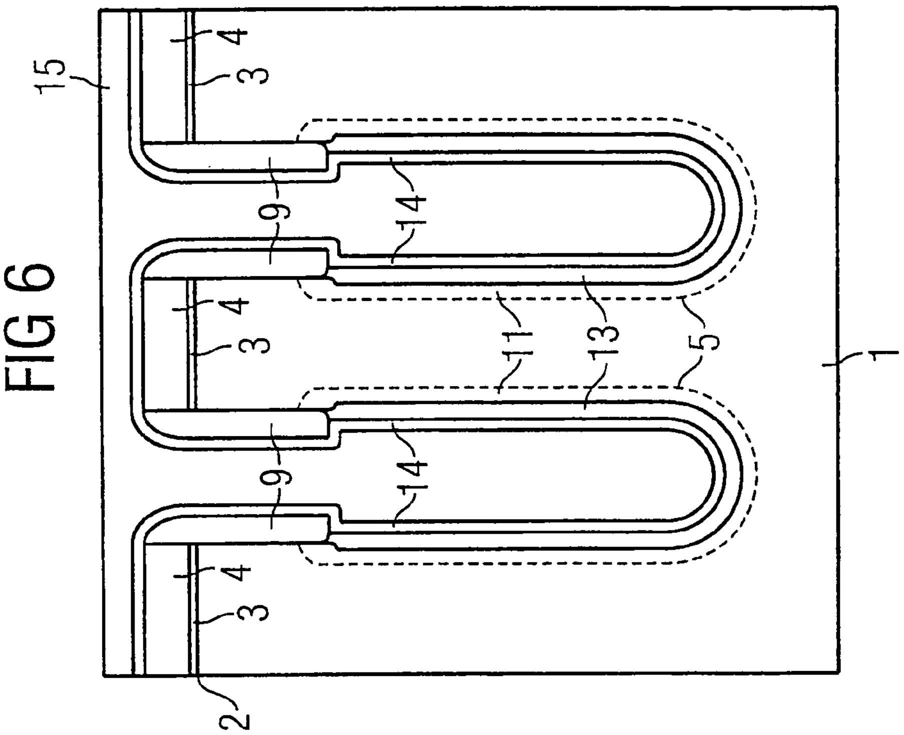

Then a 5 nm thick dielectric layer 14, which contains $SiO_2$ and $Si_3N_4$ and also, if appropriate, silicon oxynitride, is deposited as a capacitor dielectric. This layer sequence can be produced by steps for depositing nitride and for thermal oxidation, during which defects in the layer below are annealed. Alternatively, the dielectric layer 14 contains $Al_2O_3$ (aluminum oxide), $TiO_2$ (titanium dioxide), $Ta_2O_5$ (tantalum oxide). Then, a 200 nm thick in-situ doped polysilicon layer 15 is deposited, as shown in FIG. 6. Chemical mechanical polishing removes the polysilicon layer 15 down to the surface of the $Si_3N_4$ layer 4.

Then, the standard DRAM process is carried out, by means of which the upper capacitor electrode is suitably patterned and is connected to the source/drain region of a selection transistor.

Figure 7:
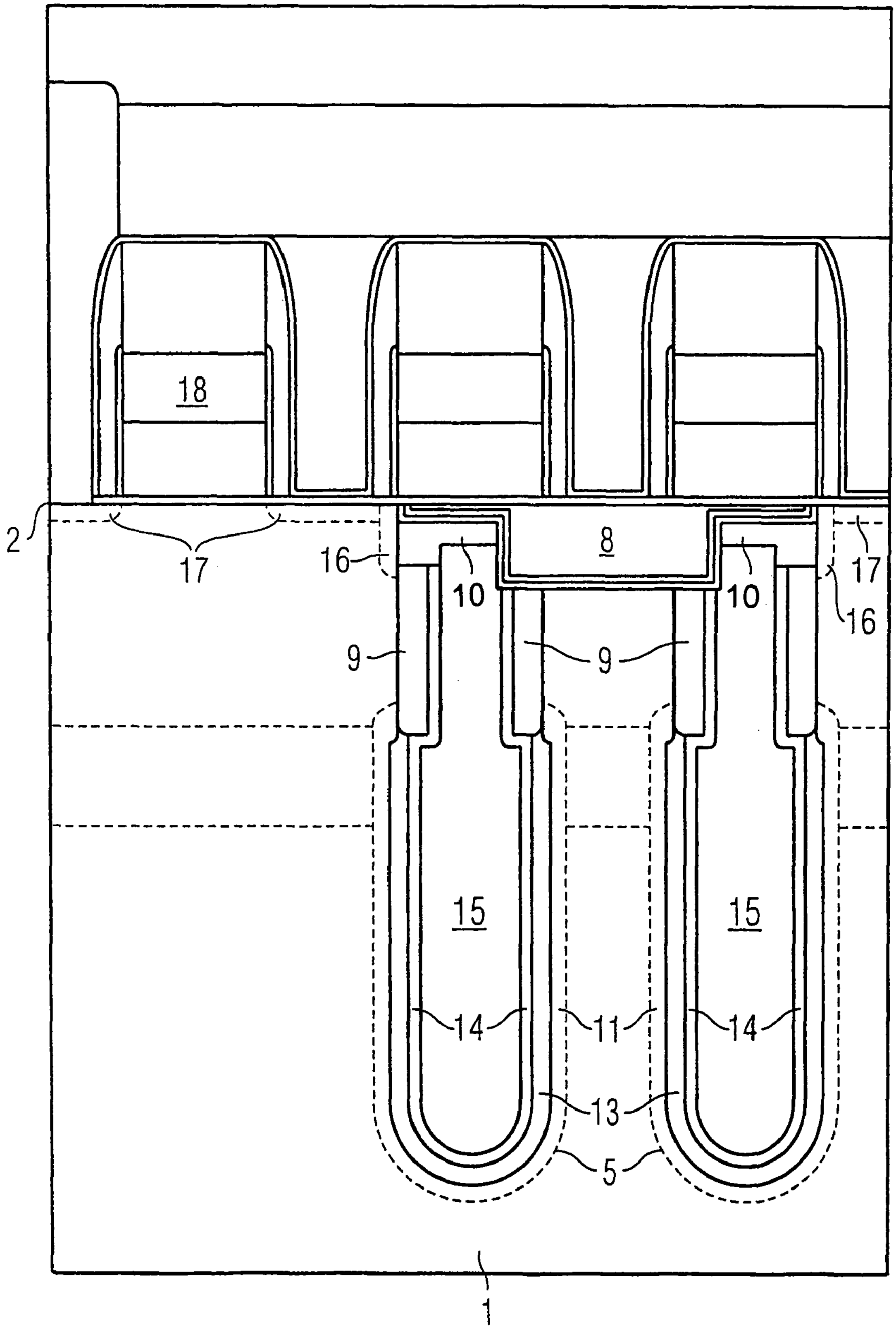

This can be achieved, for example, by etching the polysilicon filling 15 to approximately 100 nm below the main surface 2. Then an $Si_3N_4$ etch is performed using HF/ethylene glycol, in which 10 nm of $Si_3N_4$ is etched, and an etch using $NH_4F$/HF is performed, by which $SiO_2$ and dielectric material are etched. After sacrificial oxidation to form a screen oxide (not shown), an implantation step is carried out, in which an $n^+$-doped region 16 is formed in the side wall of each trench 5 in the region of the main surface 2. As shown in FIG. 7, space which has remained clear above the polysilicon filling 15 in the respective trench 5 is filled with a polysilicon filling 10 by deposition of in-situ doped polysilicon and back-etching of the polysilicon using $SF_6$. In the finished storage capacitor, the polysilicon filling 15 acts as an upper capacitor electrode. The polysilicon filling 10 acts as a connection structure between the $n^+$-doped region 16 and the polysilicon filling 15, which acts as an upper capacitor electrode.

Next, insulating structures 8 are produced, which surround the active regions and thereby define these regions. For this purpose, a mask is formed, which defines the active regions (not shown). The insulating structures 8 are completed by non-selectively plasma etching silicon, silicon nitride, $SiO_2$ and polysilicon using $CHF_3/N_2/NF_3$. The etching time is set in such a way that 200 nm of polysilicon is etched by removing the resist mask by an $O_2/N_2$ by wet-chemical etching of 3 mm of the dielectric layer, by oxidation and the deposition of a 5 nm thick $Si_3N_4$ layer and by the deposition of a 250 nm thick $SiO_2$ layer in a TEOS process and by a subsequent chemical mechanical polishing. Then, the $Si_3N_4$ layer 4 is removed by etching in hot $H_3PO_4$ and the $SiO_2$ layer 3 is removed by etching in dilute hydrofluoric acid.

Next, a screen oxide is formed by sacrificial oxidation. This step uses implantation stages and masks produced by photolithography in order to form n-doped wells, p-doped wells and to carry out threshold voltage implantations in the regions of the periphery and of the selection transistors of the cell array. Furthermore a high-energy ion implantation is carried, out in order to dope the substrate region that is remote from the main surface 2. In this way, an $n^+$-doped region, which connects adjacent lower capacitor electrodes 13 to one another, is formed (known as a buried-well implant).

Next the transistor is completed using generally known method steps, by in each case defining the gate oxide and the gate electrodes 18, corresponding interconnects and the source and drain electrode 17.

Then, the memory cell is completed in a known way by the formation of further wiring planes.

Figure 19:
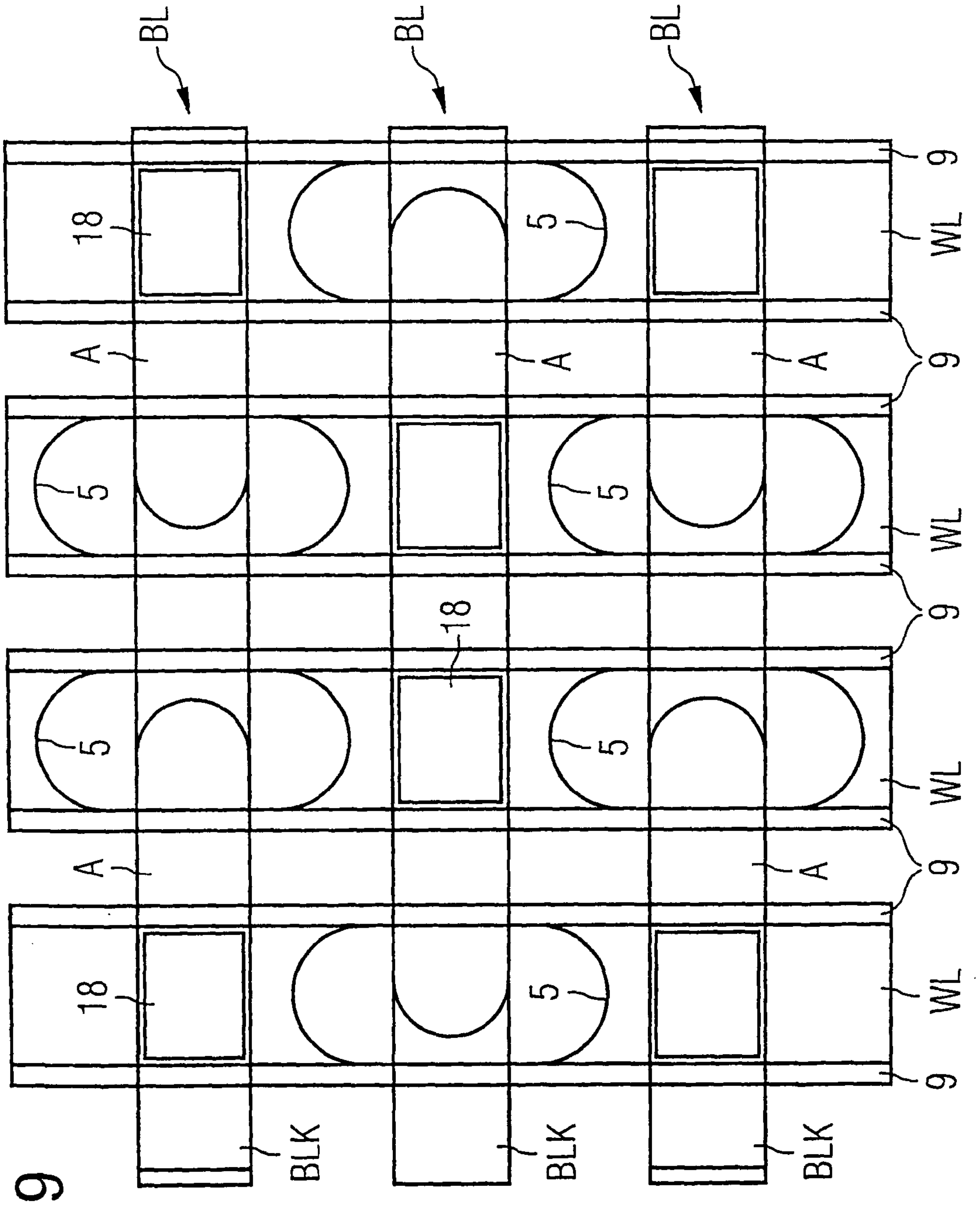
FIG. 19 shows the layout in an $8F^2$ cell architecture.

The memory cell configuration, the layout of which is illustrated by way of example for an 8-$F^2$ cell architecture in FIG. 19, has, for each memory cell, a storage capacitor configured in one of the trenches 5 and a planar selection transistor. Each memory cell takes up $8F^2$, where F is the minimum feature size in the corresponding technology. The bit lines BL run in strip form and run parallel to one another. The width of the bit line BL in each case amounts to F and the distance between the bit lines likewise amounts to F. The word lines WL, which likewise have a width of F and are spaced apart by F, run perpendicular to this direction. Beneath the bit lines BL there are active regions A. Two word lines WL cross above each active region. The active regions A are in each case configured offset with respect to one another beneath adjacent bit lines BL. In the center of the active regions A there is a bit line contact ELK that allows an electrical connection between the respective bit line EL and the active region A. The trenches 5 are configured beneath the word line WL. The gate electrode 26 of the associated selection transistor is in each case configured within the active regions at the intersection point between one of the bit lines BL and one of the word lines WL.

The active regions A in each case extend between two trenches 5. They include two selection transistors that are connected to the associated bit line BL via a common bit line contact BLK. Depending on which of the word lines WL is actuated, the information item is read from the storage capacitor that is configured in one or other of the trenches 5.

Figure 8:
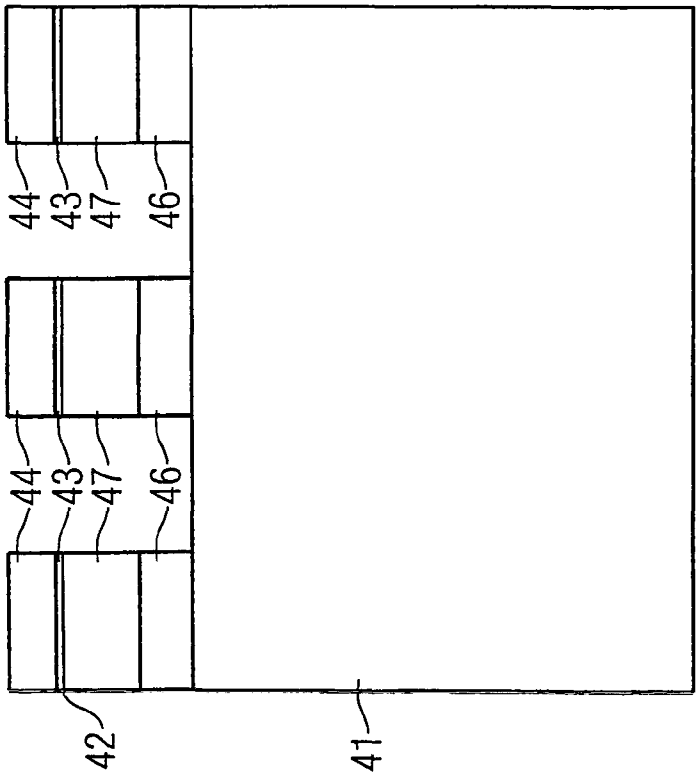

According to a further exemplary embodiment, as illustrated in FIG. 8, an SOI substrate 41, i.e. a silicon substrate with a buried $SiO_2$ layer 46, is used. An $SiO_2$ layer 43 in a thickness of 5 nm and, an $Si_3N_4$ layer 44 in a thickness of 200 nm are applied to a main surface 42 of the SOI substrate 41. Above this, a BSG layer (not shown) is deposited in a thickness of 1000 nm, then an $Si_3N_4$ layer (not shown) in a thickness of 200 nm and a polysilicon layer (not shown) in a thickness of 350 nm, in each case is deposited as a hard mask material. The polysilicon layer, the silicon nitride layer, the BSG layer and the nitride layer are etched by plasma etching using $CHF_3/O_2$ and a mask (not shown) that is patterned by photolithography and defines the configuration of the storage capacitors. Then, the active Si layer 47 is etched by plasma etching using $HBr/NF_3$ and the buried oxide layer 46 is etched by plasma etching using $CHF_3/O_2$. The parameters of this etching step are such that the trenches are only etched as far as the lower end of the buried oxide layer 46.

Figure 9:
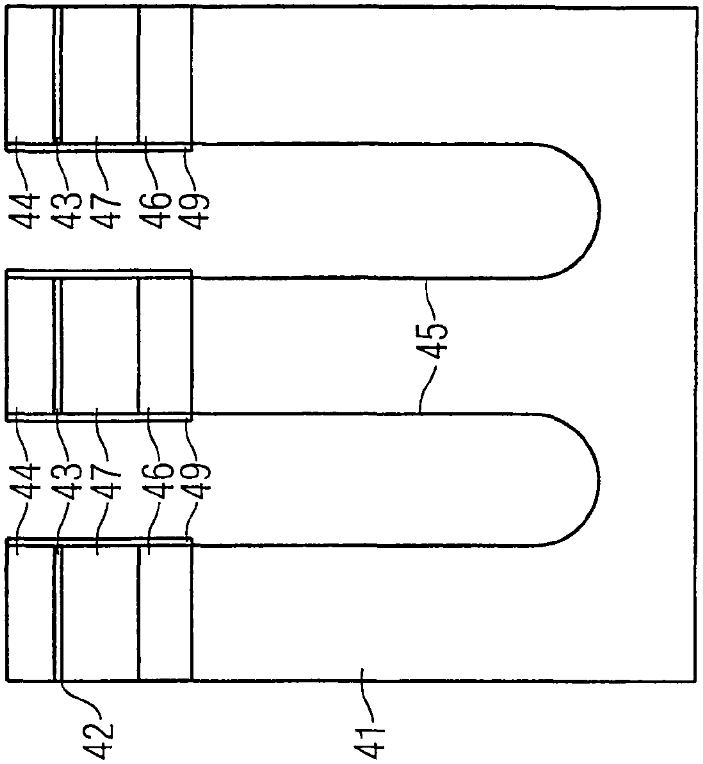
FIGS. 8–14 are cross-sectional views of a silicon substrate for illustrating the steps of a second embodiment of the method for fabricating the lower electrode of a memory cell.

After removing the BSG hard mask, a 5 nm thick $Si_3N_4$ layer 49 is deposited as spacer material. Since in this embodiment the parasitic transistor is avoided by the buried $SiO_2$ layer, the $Si_3N_4$ layer in this case is not used to disconnect this parasitic transistor. Rather, its role is to prevent the diffusion of dopants during a subsequent step for doping the substrate by doping from the vapor phase or from the doped $SiO_2$ layer in the upper capacitor region (active region 47). To achieve this, a thickness of 5 nm is sufficient. Then, the capacitor trenches 45 are etched down to a depth of 5 $\mu$m by plasma etching using $HEr/NF_3$, as illustrated in FIG. 9.

The etching of the capacitor trenches may in this case take place in such a manner that the lower regions of the trenches 45 are widened, i.e. in the region that is remote from the main surface 42. By way of example, the cross section of the lower region of the trenches 45 can be widened by about 40 nm. In this way, the capacitor area and therefore the capacitance of the capacitor can be increased further.

The drawings illustrate the process sequence with unwidened trenches.

Afterwards, the silicon substrate is doped. This can be achieved, for example, by depositing an arsenic-doped silicate glass layer in a layer thickness of 50 nm and a TEOS-$SiO_2$ layer in a thickness of 20 nm, followed by a heat treatment step at 1000° C., 120 seconds, with the result that an $n^+$-doped region 58 is formed in the silicon substrate 41 by diffusion out of the arsenic-doped silicate glass layer. Alternatively, it is also possible to carry out vapor phase doping, for example with the following parameters: 900° C., 399 Pa tributylarsine (TBA) (33 per cent), 12 min.

The $n^+$-doped region 58 reduces the size of the depletion zone, with the result that the capacitance of the capacitor is increased further. When using a metallic bottom electrode, this doped layer is used to produce an ohmic contact between substrate and metal.

Figure 10:
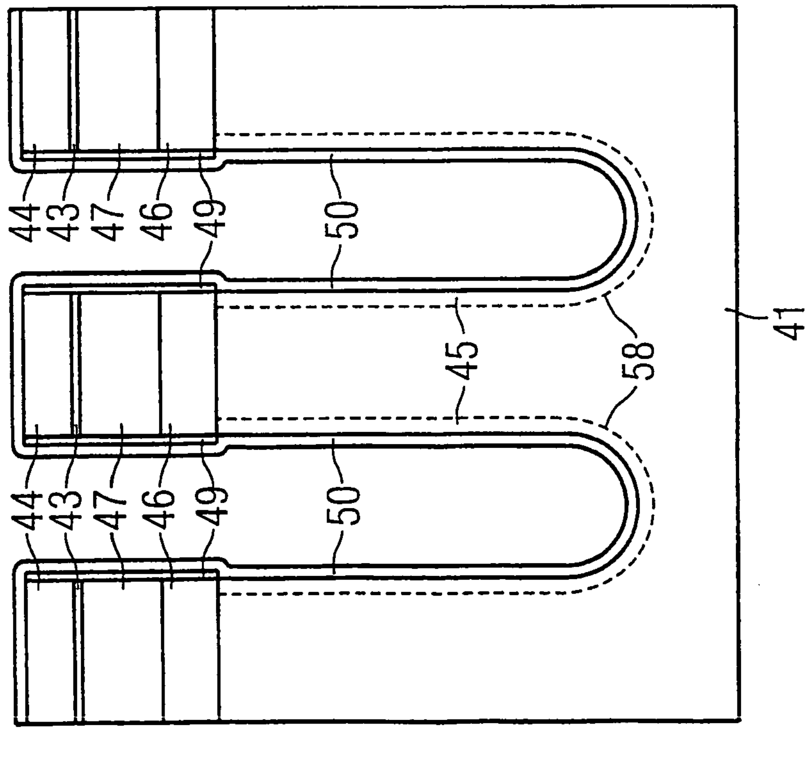

Next, a 10 nm thick tungsten layer 50 is deposited over the entire surface, for example using a CVD method (See FIG. 10).

Figure 11:
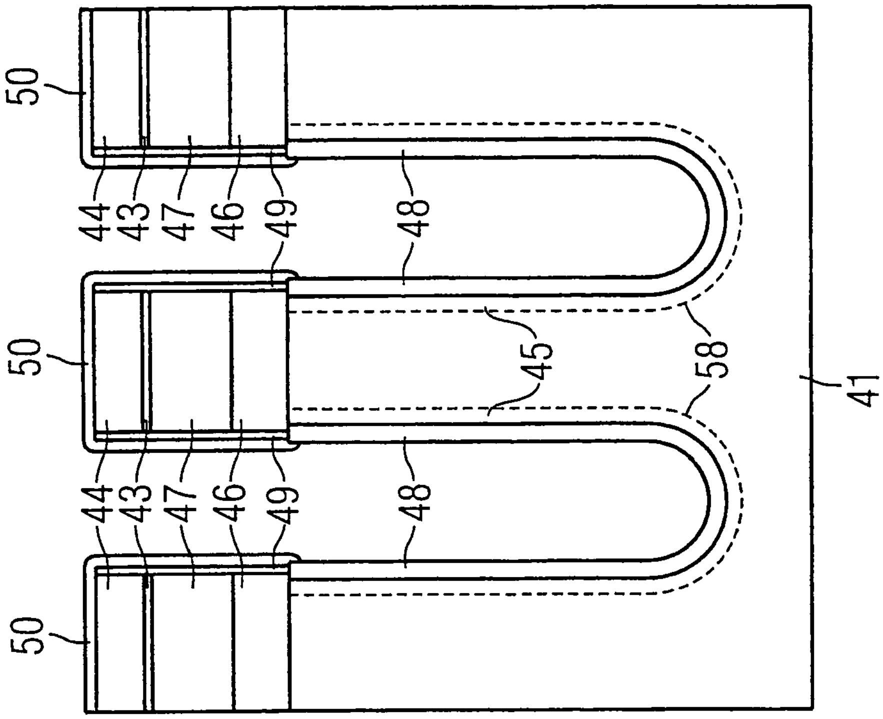

The self-aligned tungsten silicide is formed in a subsequent heat treatment step at 600 to 800° C. in a nitrogen atmosphere ($N_2$-RTP, rapid thermal annealing). More specifically, tungsten silicide 48 forms only at the locations at which the tungsten has been deposited directly on the silicon, while the metal which has been deposited directly on the nitride does not react with the substrate. This is illustrated in FIG. 11. A slight widening of the capacitor trenches results in this step from the fact that silicon is consumed at the walls of the trenches for the formation of tungsten silicide.

According to a preferred embodiment, this heat treatment step can be set in such a way that not all the tungsten forms a silicide all the way through. Consequently, as described above, it is possible to produce particularly thin metal electrodes. In addition, it is possible to compensate for inhomogeneities in the layer thickness of the metal.

Figure 12:
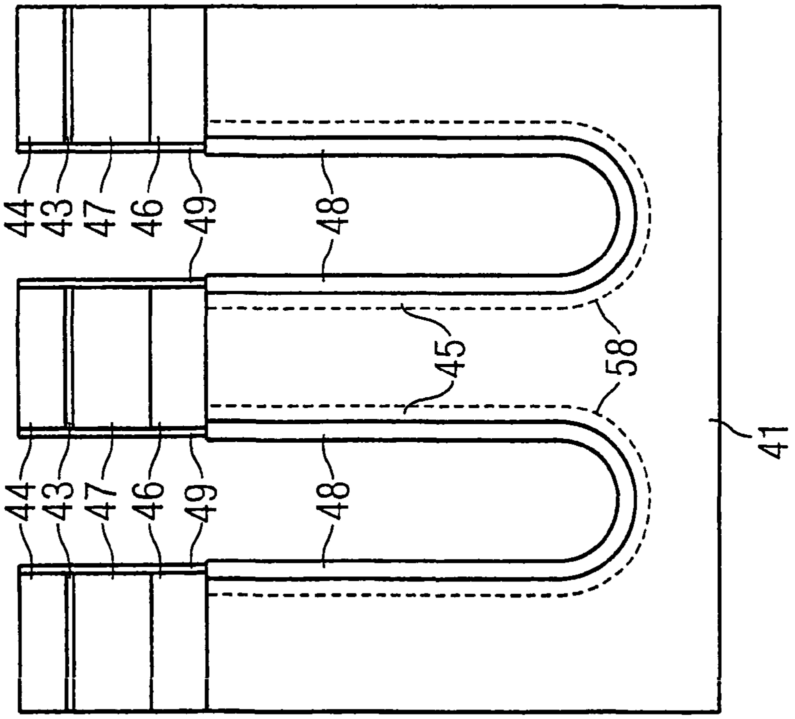

Finally, the tungsten is etched selectively with respect to the tungsten silicide 48, This can be achieved, for example, by, wet etching in $H_2O/NH_4OH/H_2O_2$ (See FIG. 12).

This step does not attack the part of the tungsten layer which had been deposited on the uncovered silicon and reacted therewith to form tungsten silicide during the heat treatment step, while the part of the tungsten layer which has been deposited on the silicon nitride or silicon dioxide and, if appropriate, the unreacted part of the tungsten layer deposited on the silicon is removed. Accordingly, what remains after this selective etching step is a self-aligned tungsten silicide layer that covers the previously uncovered silicon regions.

If appropriate, a second heat treatment step can then be carried out at 960° C. in a nitrogen atmosphere ($N_2$-RTP, rapid thermal annealing). This step restructures the $WSi_x$ formed and causes free tungsten and silicon bonds to be saturated by nitrogen.

Figure 13:
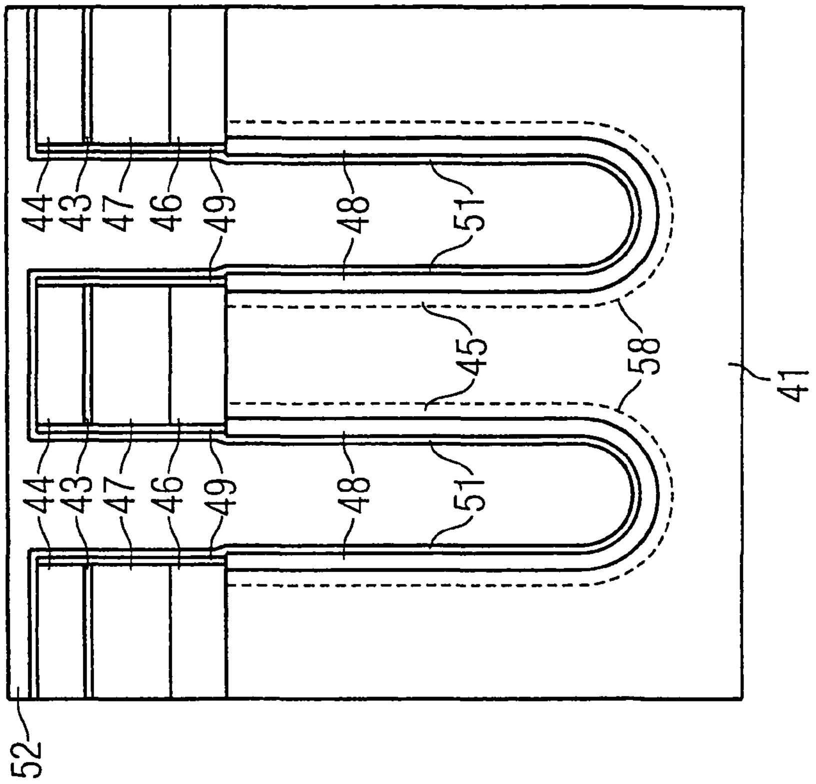

Next, a 5 nm thick dielectric layer 51, which contains $SiO_2$ and $Si_3N_4$ and also, if appropriate, silicon oxynitride, is deposited as a capacitor dielectric. Alternatively, the dielectric layer 51 contains $Al_2O_3$ (aluminum oxide), $TiO_2$ (titanium dioxide), $Ta_2O_5$ (tantalum oxide). Then, a 200 nm thick in-situ doped polysilicon layer 52 is deposited, as shown in FIG. 13. The polysilicon layer 52 is removed down to the surface of the $Si_3N_4$ layer 44 by chemical mechanical polishing.

Then, the standard DRAM process is carried out to suitably pattern the upper capacitor electrode and connect it to the source or drain electrode 56 of a selection transistor.

Figure 14:
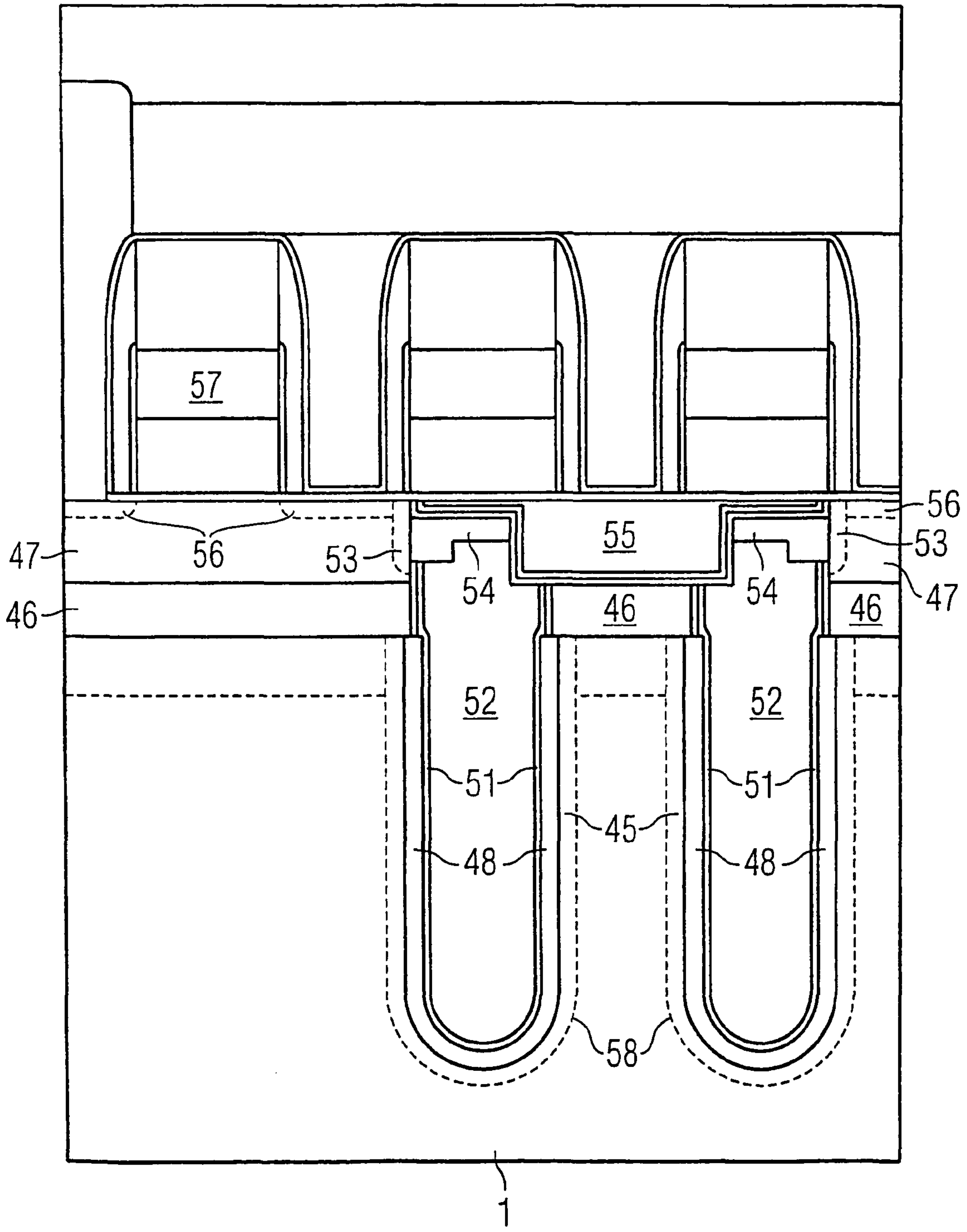

This can be achieved, for example, by etching the polysilicon filling 52 to approximately 100 nm below the main surface 42. There follows, an $Si_3N_4$ etch using HF/ethylene glycol, during which 10 nm of Si3N4 is etched, and an etch using $NH_4F$/HF, which is used to etch $SiO_2$ and dielectric material. After a sacrificial oxidation step to form a screen oxide (not shown), an implantation is carried out, in which an $n^+$-doped region 53 is formed in the side wall of each trench 45 near the main surface 42. As shown in FIG. 14, space in the respective trench 45, which remains clear above the polysilicon filling 52, is filled with a polysilicon filling 54 by the deposition of in-situ doped polysilicon and etching back the polysilicon using $SF_6$.

In the finished storage capacitor, the polysilicon filling 52 acts as an upper capacitor electrode. The polysilicon filling 54 acts as a connection structure between the $n^+$-doped region 53 and the polysilicon filling 52 that acts as the upper capacitor electrode.

Then, insulation structures 55 are produced, which surround the active regions and thereby define these regions. For this purpose, a mask which defines the active regions (not shown) is formed. The insulation structures 55 are completed by non-selective plasma etching of silicon, silicon nitride, $SiO_2$ and polysilicon using $CHF_3/N_2/NF_3$. The etching time is set in such a way that 200 nm of polysilicon is etched by removing the resist mask used in this etching using $O_2/N_2$, by wet-chemical etching of 3 nm of the dielectric layer, by oxidation and the deposition of a 5 nm thick $Si_3N_4$ layer, and by the deposition of a 250 nm thick $SiO_2$ layer using a TEOS process and a subsequent chemical mechanical polishing. Then, the $Si_3N_4$ layer 44 is removed by etching in hot $H_3PO_4$ and the $SiO_2$ layer 43 is removed by etching in dilute hydrofluoric acid.

Next, a screen oxide is formed by sacrificial oxidation. Implantations and masks that are produced by photolithography are used to form n-doped wells, p-doped wells and to carry out threshold voltage implantations in the region of the periphery and the selection transistors of the cell array. Furthermore, a high-energy ion implantation is carried out in order to dope the substrate region that is remote from the main surface 42. In this way, an $n^+$-doped region that connects adjacent lower capacitor electrodes 48 to one another is formed.

Next, the transistor is completed using generally known method steps involving defining in each case the gate oxide and the gate electrodes 57, corresponding interconnects, and the source and drain electrode 56.

Then, the memory cell is completed in a known way by forming further wiring planes.

According to the present invention, the method for fabricating the lower capacitor electrode can also be applied to a stacked capacitor of a DRAM memory cell. Unlike the fabrication methods described above, in this case the lower capacitor electrode is not formed, in a trench formed in a silicon material, but rather on the surface of a polysilicon contact structure which connects the source/drain region of the selection transistor to the lower capacitor electrode.

Figure 15:
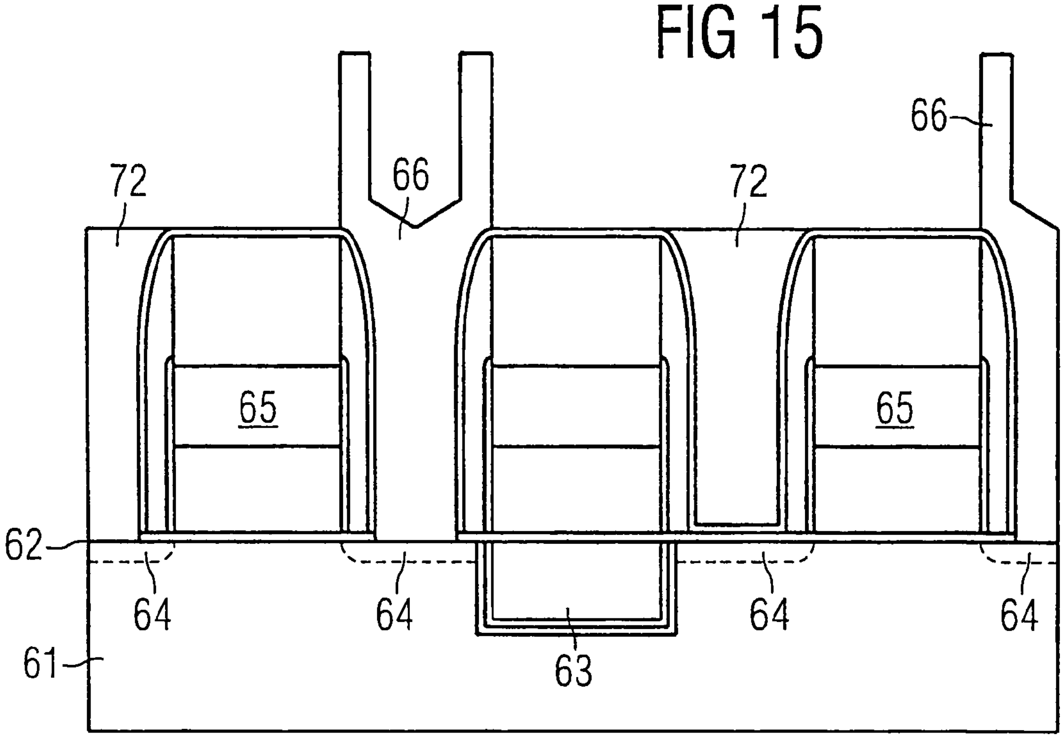
FIGS. 15–18 are cross-sectional views of a silicon substrate for illustrating the steps of a third embodiment of the method for fabricating the lower electrode of a memory cell.

According to the third embodiment of the present invention, structures are produced on a silicon substrate in accordance with the standard DRAM process for stacked capacitors. More specifically, first of all, as illustrated in FIG. 15, generally known methods are used to define the active regions in a main surface 62 of a silicon substrate 61, as a result of insulating structures 63 being formed by etching isolation trenches and filling the isolation trenches with a thin $Si_3N_4$ layer and $SiO_2$. Then, to fabricate the word lines, first of all a thin $SiO_2$ layer is produced as gate oxide by thermal oxidation, then, to fabricate the gate electrodes 65, a polysilicon layer, a tungsten silicide layer and 200 to 300 nm of $Si_3N_4$ are deposited over the entire surface and are suitably patterned. Next, thermal oxidation is used to apply an $SiO_2$ layer and, moreover, a nitride deposition method is used to apply an $Si_3N_4$ layer as a spacer layer, and these layers are then patterned, so that the lateral flanks of the gate electrodes 65 are covered with these layers.

In accordance with what is known as the folded-bit line architecture, the middle word line illustrated in FIG. 15 serves as what is known as a passing word line, i.e. as a word line for the gate electrode of the memory cell located in front of or behind the plane of the drawing.

Next, the source and drain electrodes 64 are formed in a self-aligned manner by ion implantation using the gate electrodes 65 as implantation masks.

Then, the spaces between the word lines are filled by the deposition of BSG or BPSG and a subsequent heat treatment, during which the BSG 72 or BPSG flows. A TEOS method is used to apply $SiO_2$ (not shown) to the resulting surface. Contact holes are etched through the $SiO_2$ and the BSG 72, selectively with respect to $Si_3N_4$, down to the source/drain region at the locations at which the contact structures 66 between lower capacitor electrode 67 and source or drain electrode 64 of the selection transistor are to be formed.

Then, an in-situ doped polysilicon layer 66 is applied in a thickness which is such that the lower part of the contact holes, which extend between adjacent word lines, is completely filled with polysilicon, while the upper part of the contact holes, which extend through the $SiO_2$ layer, is lined with a thin film of polysilicon, i.e. hollow cylinders or cups are formed at this location. The polysilicon that has been deposited on the $SiO_2$ surface is removed by chemical mechanical polishing, and then the $SiO_2$ is etched away at the surface. The result is the structure shown in FIG. 15.

Then, by way of example, a CVD method is used to deposit a thin layer of tungsten over the entire surface.

The self-aligned tungsten silicide 67 is formed in a subsequent heat treatment step at 600 to 800° C. in a nitrogen atmosphere ($N_2$-RTP, rapid thermal annealing). More specifically, tungsten silicide is formed only at the locations at which the tungsten has been deposited directly on the silicon, while the metal which has been deposited directly on the nitride or the spaces filled with SSG does not react with the substrate.

According to a preferred embodiment, this heat treatment step can be set in such a way that not all the tungsten forms a silicide all the way through. This makes it possible, as described above, to produce particularly thin metal electrodes.

Figure 16:
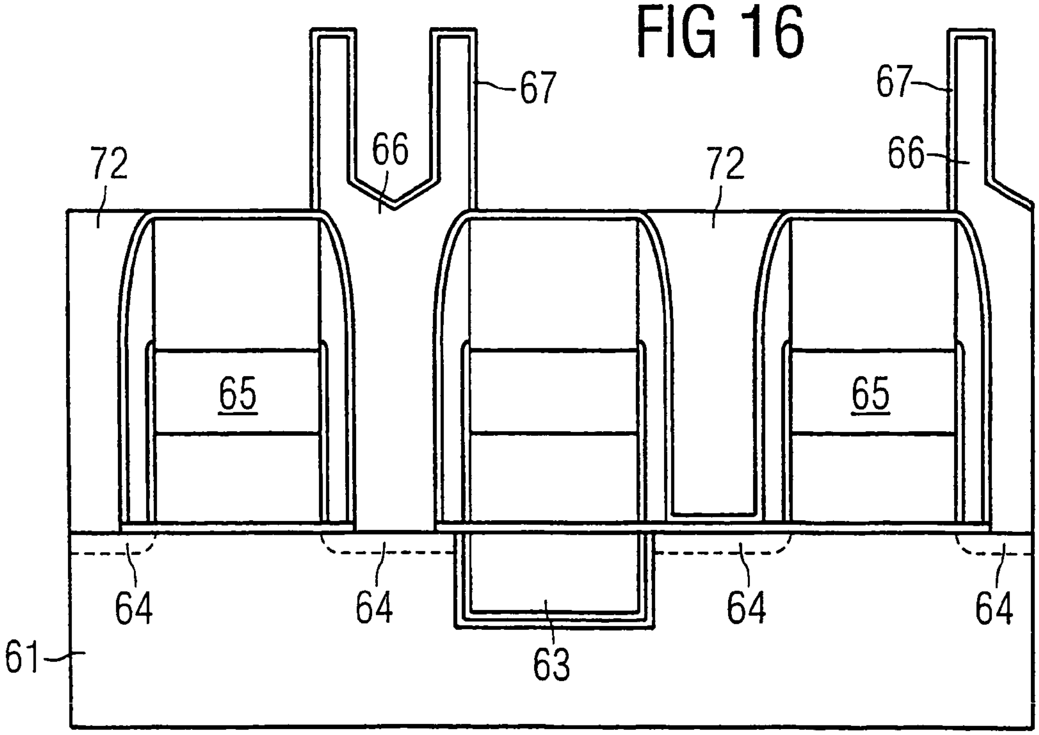

Finally, the tungsten is etched selectively with respect to tungsten silicide. This can be achieved, for example, by wet etching in $H_2O/NH_4OH/H_2O_2$ (See FIG. 16).

This step does not attack the part of the tungsten layer which had been deposited on the uncovered silicon and reacted therewith to form tungsten silicide during the heat treatment step, while the part of the tungsten layer which has been deposited on the silicon nitride or BSG, and, if appropriate, the unreacted part of the tungsten layer deposited on the silicon is removed. Accordingly what remains after this etching step is a self-aligned tungsten silicide layer 67 which covers the silicon regions previously applied selectively.

If appropriate, a second heat treatment step can then be carried out at approximately 800° C. in a nitrogen atmosphere ($N_2$-RTP, rapid thermal annealing). This step restructures the WSiX formed and causes free tungsten and silicon bonds to be saturated by nitrogen.

Figure 17:
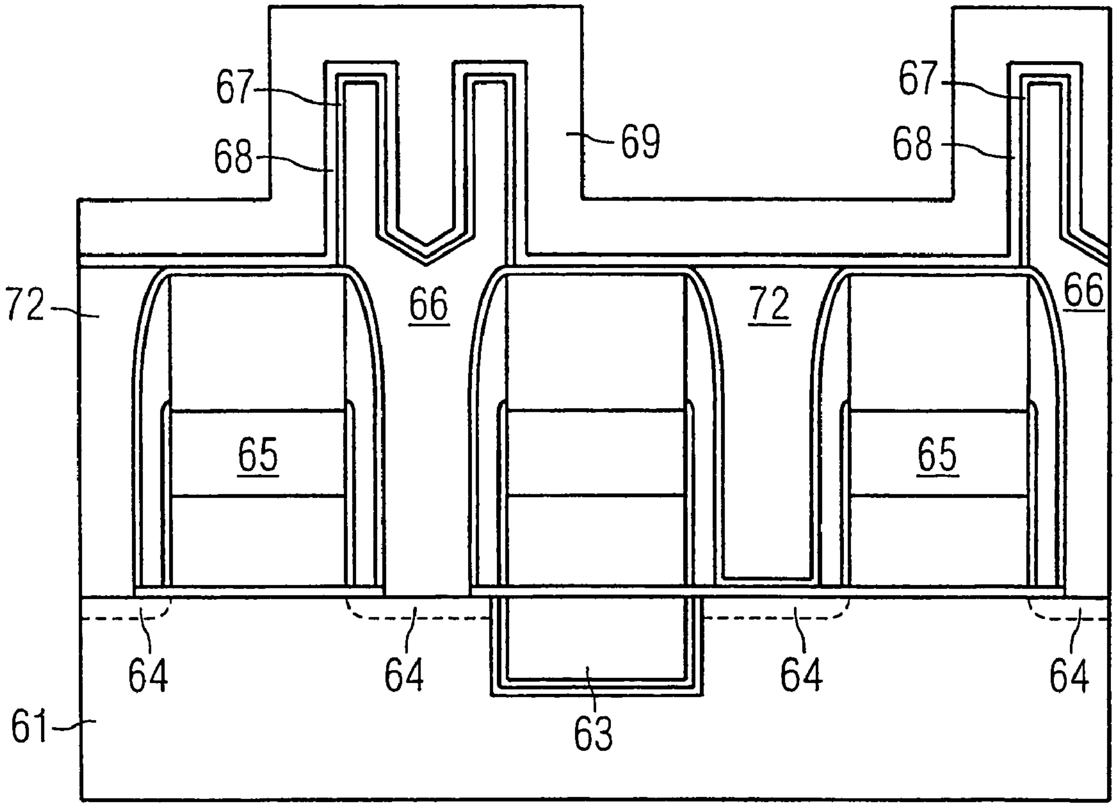
Figure 18:
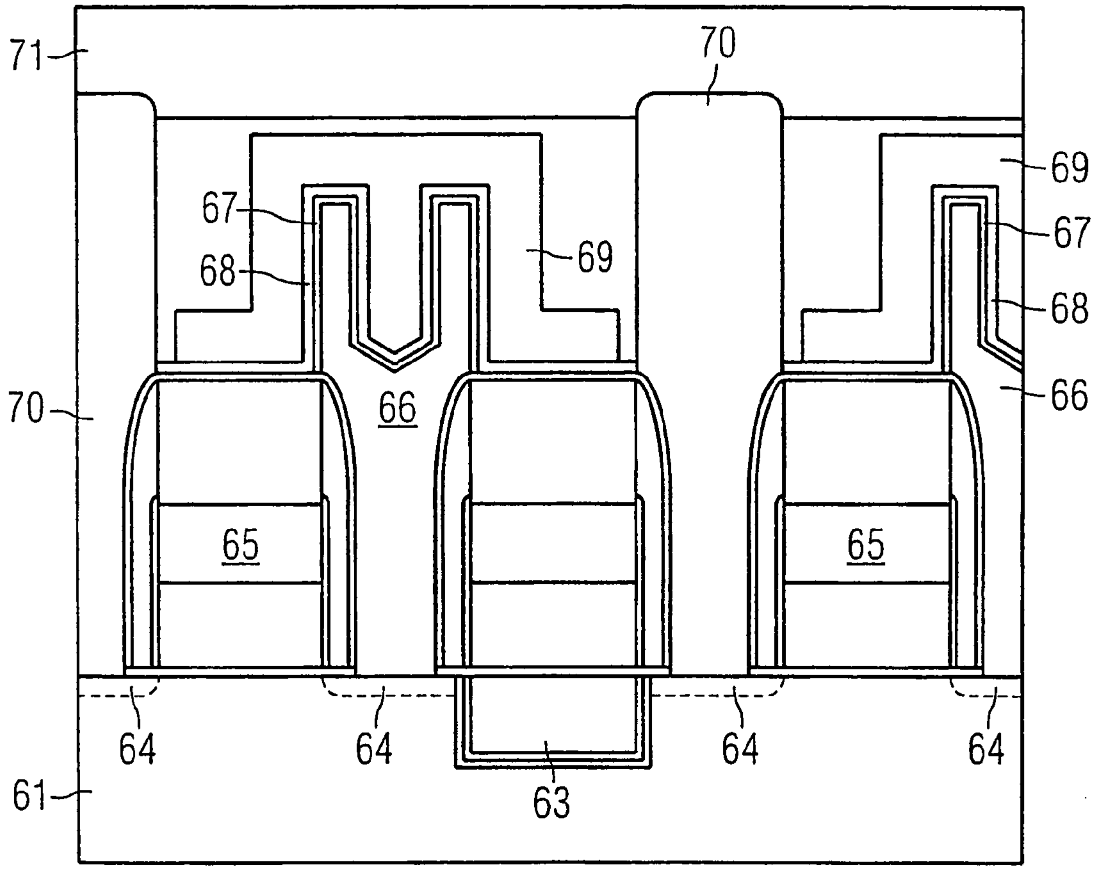

Next, a 5 nm thick dielectric layer 68, which contains $SiO_2$ and $Si_3N_4$ and also, if appropriate, silicon oxynitride, is deposited as capacitor dielectric. Alternatively, the dielectric layer 68 contains $Al_2O_3$ (aluminium oxide), $TiO_2$ (titanium dioxide), $Ta_2O_5$ (tantalum oxide). Then, a tungsten silicide layer is deposited as upper capacitor electrode 69, as shown in FIG. 17. The thickness of the tungsten silicide layer may be such that the cup which has been lined with the lower capacitor electrode and dielectric is completely filled, i.e. the thickness of the deposited layer is approximately 50 to 100 nm.

After patterning the dielectric layer and the upper capacitor electrode using known methods, further insulating layers are produced, bit line contacts 70 are fabricated and then the bit lines 71 are defined.

The method described in accordance with the third embodiment is advantageous over the conventional method for forming stacked capacitors in that the connecting structure made from polysilicon is suitably patterned prior to the deposition of the metal, so that uncovered silicon regions are present only at the locations at which the lower capacitor electrode is to be formed. Accordingly, metal silicide is only formed or deposited at these locations, so that it is no longer necessary for any metal silicide to be removed during the subsequent steps. As a result, the method for fabricating the lower capacitor electrode can be simplified considerably.

We claim:

1. A method for fabricating a trench capacitor, which comprises the following sequential order of steps:

etching a trench into a main surface of a silicon substrate;

producing covered silicon regions by applying a covering material to regions of the trench on which a lower, metallic capacitor electrode should not be formed;

forming the lower, metallic capacitor electrode in a self-aligned manner by selectively forming a metal silicide on uncovered silicon regions such that the capacitor is at least partially configured in the trench and the lower, metallic capacitor electrode adjoins a wall of the trench; and after forming the lower, metallic capacitor electrode, providing a storage dielectric on the lower, metallic capacitor electrode and providing an upper capacitor electrode on the storage dielectric.

2. The method according to claim 1, which further comprises selecting the covering material from a group consisting of silicon nitride, silicon dioxide, and a combination of silicon nitride and silicon dioxide.

3. The method according to claim 1, wherein the step of selectively forming the metal silicide on the uncovered silicon regions includes:

depositing a metal being suitable for forming a metal-silicon compound with uncovered silicon in a subsequent heat treatment step;

performing a heat treatment at a predetermined temperature in a predetermined atmosphere: and selectively removing the metal that was not converted into silicide.

4. The method according to claim 3, wherein the heat treatment step is carried out at a temperature of 600 to 1000° C. in a nitrogen atmosphere.

5. The method according to claim 3, wherein the heat treatment step is performed for a duration such that only a part of the metal facing the uncovered silicon forms a metal-silicon compound.

6. The method according to claim 1, which further comprises using a metal selected from a group consisting of tungsten, titanium, molybdenum, tantalum, cobalt, nickel, niobium, platinum, palladium and rare earths to form the metal silicide, performing a heat treatment step at a temperature of 600 to 1000° C. in a nitrogen atmosphere for a duration such that only a part of a metal facing an uncovered silicon forms a metal-silicon compound, and selectively depositing metal silicide for a vapor phase on uncovered silicon regions at locations where a lower capacitor electrode will be formed.

* * * * *